United States Patent
Hanji et al.

(10) Patent No.: US 6,873,556 B2
(45) Date of Patent: Mar. 29, 2005

(54) SEMICONDUCTOR MEMORY DEVICE WITH TEST MODE AND TESTING METHOD THEREOF

(75) Inventors: Hikoshi Hanji, Hyogo (JP); Yasuhiro Matsui, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 219 days.

(21) Appl. No.: 10/377,596

(22) Filed: Mar. 4, 2003

(65) Prior Publication Data

US 2004/0081008 A1 Apr. 29, 2004

(30) Foreign Application Priority Data

Oct. 25, 2002 (JP) ........................................ 2002-311297

(51) Int. Cl.⁷ ............................................... G11C 7/00
(52) U.S. Cl. .................. 365/201; 365/230.03; 365/233; 365/239
(58) Field of Search .......................... 365/201, 230.03, 365/233, 239

(56) References Cited

U.S. PATENT DOCUMENTS

| | | | |
|---|---|---|---|
| 5,483,488 A | * | 1/1996 | Sanada ........................ 365/201 |
| 2004/0151037 A1 | * | 8/2004 | Benedix et al. ............. 365/200 |

FOREIGN PATENT DOCUMENTS

JP          59-175100          10/1984

* cited by examiner

*Primary Examiner*—Huan Hoang
(74) *Attorney, Agent, or Firm*—McDermott Will & Emery LLP

(57) ABSTRACT

A synchronous SRAM includes a register sequentially providing data signals of the burst length in a test mode, and a transfer circuit applying data signals output from the register to a memory array for burst-writing, and providing to an external source via an IO buffer a data signal read out in a burst manner later than the burst writing by 1 clock cycle. It is not necessary to additionally apply a data signal for writing. The required number of address signals can be reduced. Thus, testing can be simplified.

5 Claims, 8 Drawing Sheets

US 6,873,556 B2

SEMICONDUCTOR MEMORY DEVICE WITH TEST MODE AND TESTING METHOD THEREOF

BACKGROUND OF THE INVENTION

1. Field of the Invention

The present invention relates to a semiconductor memory device and a testing method thereof. Particularly, the present invention relates to a semiconductor memory device operating in synchronization with a clock signal, having a test mode to test whether each memory cell is proper or not, and a testing method thereof.

2. Description of the Background Art

Semiconductor memory devices such as SRAM (Static Random Access Memory) and DRAM (Dynamic Random Access Memory) are conventionally subjected to testing prior to shipment to determine whether each memory cell is proper or not. This testing includes the steps of writing predetermined data into each of a plurality of memory cells included in the memory array, and reading out data from each memory cell. Determination is made that a memory cell is proper when the logic of data read out from that memory cell matches the logic of the data read into that memory cell. A memory cell is determined to be defective when such logics of data do not match. A defective memory cell is replaced with a spare memory cell.

Some testing methods conduct writing of external data into a memory cell and reading out data from another memory cell concurrently (for example, refer to Japanese Patent Laying-Open No. 59-175100).

In the conventional testing method, a data signal is written after an address signal and the data signal are applied to the semiconductor memory device from a tester, and a data signal is read out after an address signal is applied to the semiconductor memory device from the tester. There was a disadvantage that the testing operation is complex.

SUMMARY OF THE INVENTION

An object of the present invention is to provide a semiconductor memory device and a testing method thereof that can readily test whether each memory cell is proper or not.

According to an aspect of the present invention, a semiconductor memory device includes a plurality of memory cells, a register sequentially providing one by one N (N is an integer of at least 2) data signals that are written in advance in a test mode testing whether each memory cell is proper or not, a decoder sequentially selecting one by one N memory cells among the plurality of memory cells according to an address signal, a write circuit sequentially writing the N data signals output from the register into the N memory cells selected by the decoder, and a read circuit operating later than the write circuit by M (M is an integer of at least 1 and not more than N−1) clock cycles to sequentially read out a data signal from the N memory cells selected by the decoder. Since a data signal to be written is output from the register, a data signal for writing does not have to be additionally applied from an external source. Furthermore, since N memory cells are selected in response to one address signal and writing/reading of a data signal with respect to selected memory cells is conducted, the number of address signals to be input can be reduced. Therefore, testing is simplified.

According to another aspect of the present invention, a testing method includes the steps of rendering active the semiconductor memory device of the above aspect to set the semiconductor memory device in a test mode, applying an address signal to the decoder, and determining whether each memory cell is proper or not based on the data signal read out by the read circuit. The semiconductor memory device can be tested by applying an address signal and comparing the read out data signal with an expected value. Thus, the testing operation can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
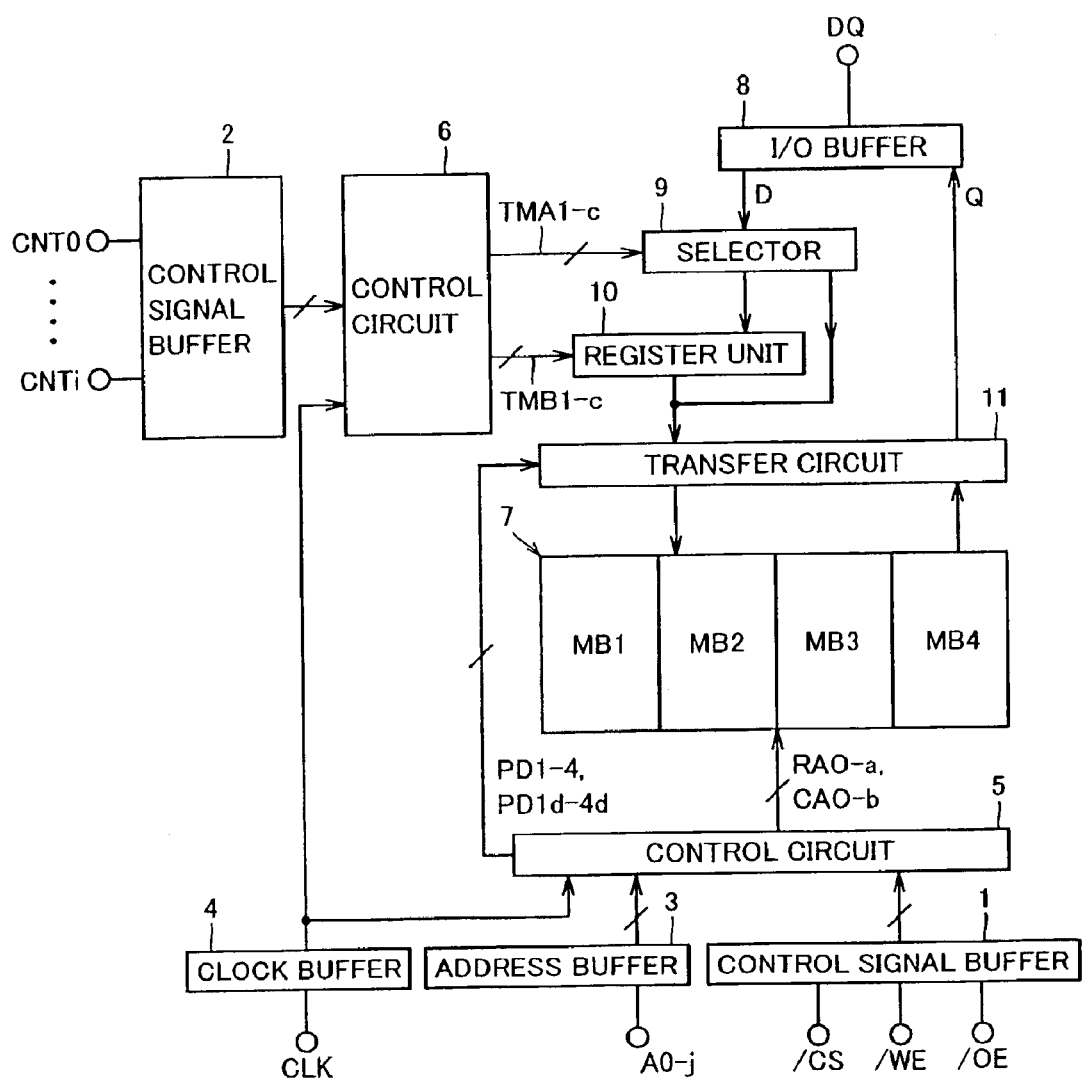
FIG. 1 is a block diagram of an entire structure of a synchronous SRAM according to an embodiment of the present invention.

Referring to FIG. 1, a synchronous SRAM according to an embodiment of the present invention includes control signal buffers 1 and 2, an address buffer 3, a clock buffer 4, control circuits 5 and 6, a memory array 7, an IO buffer 8, a selector 9, a register unit 10, and a transfer circuit 11.

Control signal buffer 1 transmits external control signals /CS, /WE, /OE to control circuit 5. Control signal buffer 2 transmits external control signals CNT0–CNTi (i is an integer of at least 0) to control circuit 6. Address buffer 3 transmits external address signals A0–Aj (j is an integer of at least 0) to control circuit 5. Clock buffer 4 supplies an external clock signal CLK to the entire SRAM.

Control circuit 5 generates various internal signals such as row address signals RA0–RAa, column address signals CA0–CAb (a and b are integers of at least 0), and transfer control signals PD1–PD4 and PD1d–PD4d according to signals /CS, /WE, /OE, . . . applied via control signal buffer 1, address buffer 3 and clock buffer 4 to provide entire control of the SRAM by the generated internal signals.

Control circuit 6 generates test mode signals TMA1–TMAc and TMB1–TMBc (c is an integer of at least 1) according to signals CNT0–CNTi applied via control signal buffer 2 to provide these signals TMA1–TMAc and TMB1–TMBc to selector 9 and register unit 10.

Memory array 7 is divided into four memory blocks MB1–MB4. Each of memory blocks MB1–MB4 includes a plurality of memory cells arranged in a plurality of rows and columns. Each memory cells stores one data signal.

IO buffer 8 outputs from the semiconductor memory device a read out data signal Q applied from memory array 7 via transfer circuit 11, and provides to selector 9 an externally applied write data signal D. In a test mode, selector 9 is under control of control circuit 6 through signals TMA1–TMAc to apply write data signal D from IO buffer 8 to register unit 10. In a normal operation mode, selector 9 provides write data signal D from IO buffer 8 to transfer circuit 11.

In a test mode, register unit 10 is under control of control circuit 6 through signals TMB1–TMBc to output write data signal D directed to testing to transfer circuit 11.

In a write operation, transfer circuit 11 responds to signals PD1–PD4 from control circuit 5 to select any of the four memory blocks MB1–MB4 of memory array 7, and provides write data signal D from selector 9 or register unit 10 to the selected memory block. In a read out operation, transfer circuit 11 responds to signals PD1$d$–PD4$d$ from control circuit 5 to select any of memory blocks MB1–MB4 of memory array 7, and couples the selected memory block with IO buffer 8. In a test mode, transfer circuit 11 conducts writing and reading of data signals concurrently. The operation of transfer circuit 11 in a test mode will be described in detail afterwards.

Figure 2:
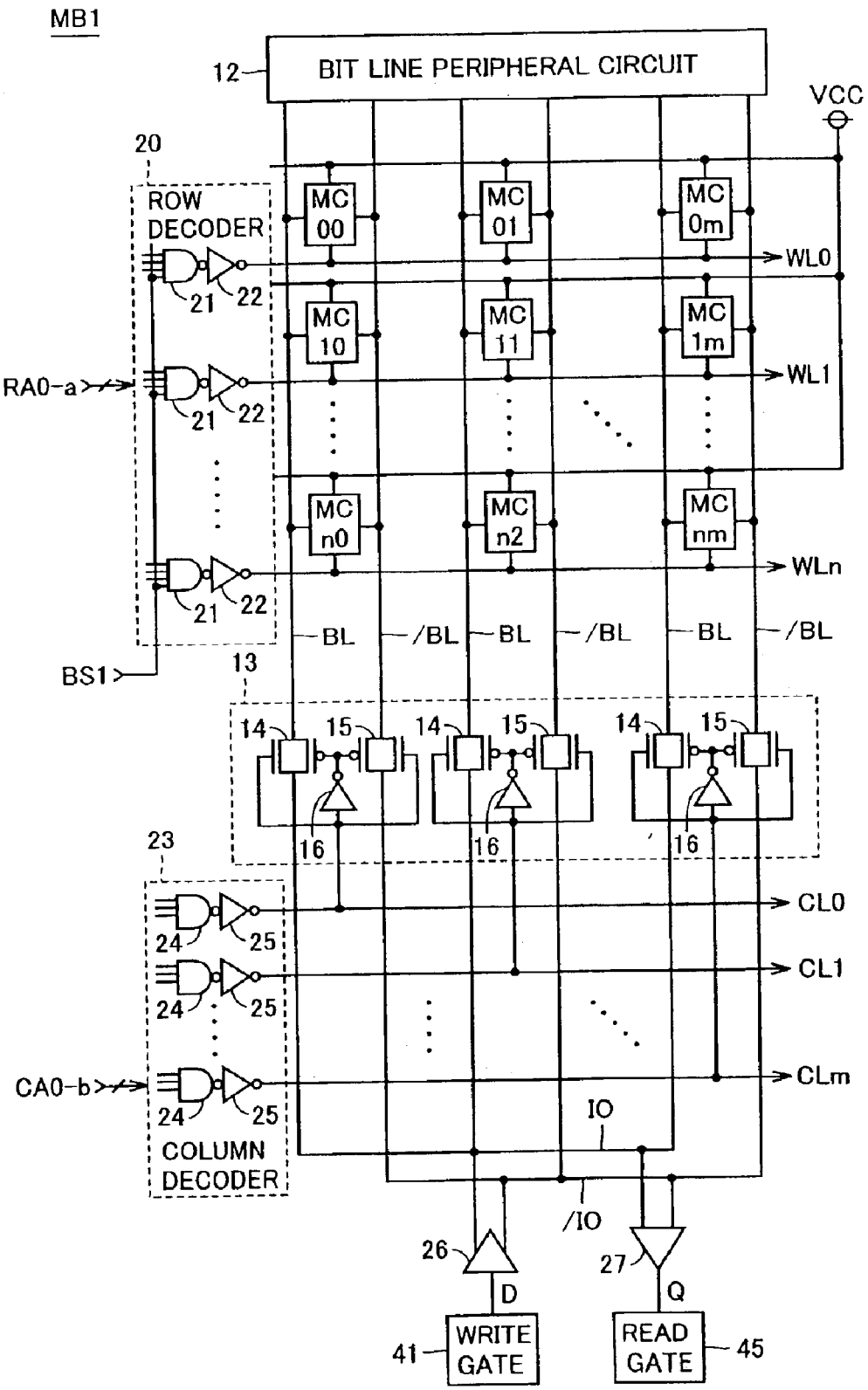
FIG. 2 is a circuit block diagram of a structure of the memory block in FIG. 1.

FIG. 2 is a circuit block diagram of a structure of memory block MB1. Referring to FIG. 2, memory block MB1 includes (n+1)×(m+1) memory cells MC arranged in (n+1) rows and (m+1) columns (each of n and m is an integer of at least 1), word lines WL0–WLn provided corresponding to the (n+1) rows, respectively, m+1 pairs of bit lines BL and /BL provided corresponding to (m+1) columns, respectively, (m+1) column select lines CL0–CLm provided corresponding to (m+1) columns, respectively, and a pair of data input/output lines IO and /IO.

Figure 3:
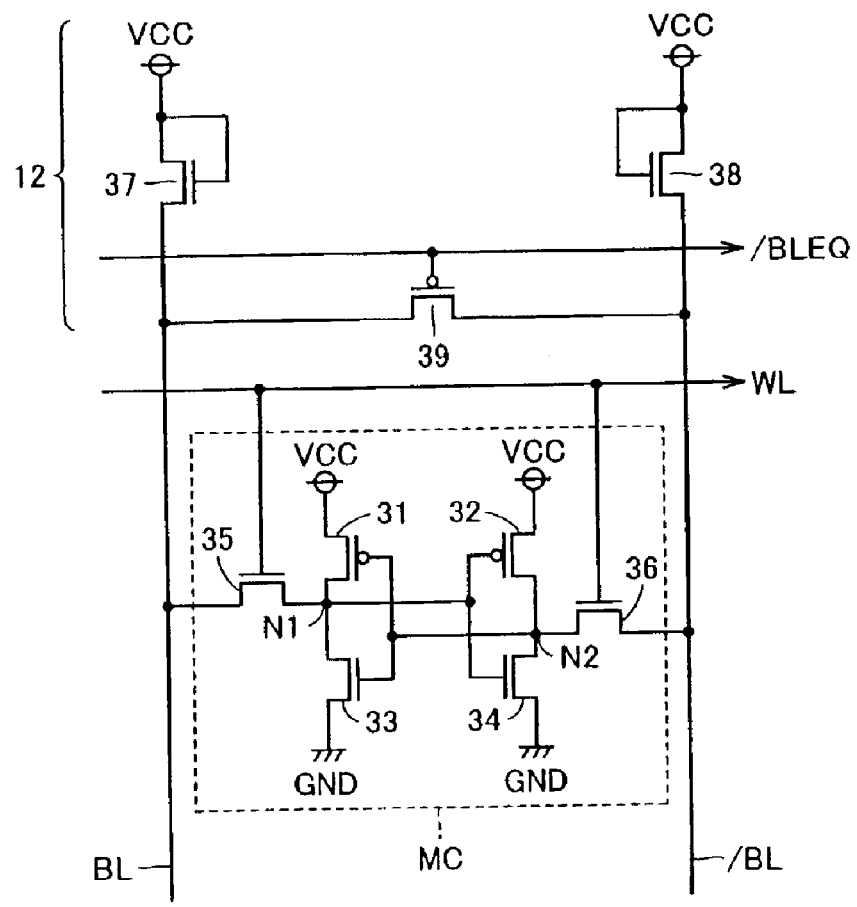
FIG. 3 is a circuit diagram of a structure of the memory cell and bit line peripheral circuit in FIG. 2.

Referring to FIG. 3, memory cell MC includes P-channel MOS transistors 31 and 32, and N-channel MOS transistors 33–36. P-channel MOS transistors 31 and 32 are connected between the line of power supply potential VCC and storage nodes N1 and N2, and have their gates connected to storage nodes N2 and N1, respectively. N-channel MOS transistors 33 and 34 are connected between respective storage nodes N1 and N2 and the line of ground potential GND, and have their gates connected to storage nodes N2 and N1, respectively.

MOS transistors 32 and 34 form a first inverter that applies to storage node N2 an inverted signal of the signal at storage node N1. MOS transistors 31 and 33 form a second inverter that applies to storage node N1 an inverted signal of the signal at storage node N2. The first and second inverters form a latch circuit storing the signals of storage nodes N1 and N2. N-channel MOS transistor 35 is connected between bit line BL and storage node N1. N-channel MOS transistor 36 is connected between bit line /BL and storage node N2. N-channel MOS transistors 35 and 36 have their gates connected to word line WL.

In a write operation, word line WL is pulled up to an H level (logical high), whereby N-channel MOS transistors 35 and 36 conduct. Then, one of bit lines BL and /BL is brought to an H level whereas the other bit line is brought to an L level according to write data signal D, whereby a signal is written into each of storage nodes N1 and N2. For example, when data signal D is at an H level (1), a signal of an H level and a signal of an L level are written into storage nodes N1 and N2, respectively. When data signal D is at an L level (0), signals of an L level and an H level are written into storage nodes N1 and N2, respectively. In response to word line WL being pulled down to an L level, N-channel MOS transistors 35 and 36 are rendered nonconductive. The signals of storage nodes N1 and N2 are latched by MOS transistors 31–34.

In a read out operation, bit lines BL and /BL are precharged to an H level, and then word line WL is pulled up to an H level. In response, N-channel MOS transistors 35 and 36 are rendered conductive. One of bit lines BL and /BL is pulled down to an L level according to the storage data of memory cell MC. For example, when storage nodes N1 and N2 are at an H level and an L level, respectively, current flows from bit line /BL to the line of ground potential GND via N-channel MOS transistors 36 and 34, whereby bit line /BL is brought to an L level. The potential of bit line BL is not reduced since N-channel MOS transistor 33 is nonconductive. By comparing the potentials of bit lines BL and /BL, a data signal can be read out from memory cell MC. Word line WL is pulled down to an L level, and the read operation ends.

One end of each bit line pair BL and /BL is connected to bit line peripheral circuit 12 whereas the other end of each bit line pair is connected to column select gate 13. As shown in FIG. 3, bit line peripheral circuit 12 includes N-channel MOS transistors 37 and 38 and a P-channel MOS transistor 39 corresponding to each bit line pair BL and /BL. N-channel MOS transistors 37 and 38 are diode-connected between the line of power supply potential VCC and one end of bit lines BL and /BL to charge respective bit lines to an H level. P-channel MOS transistor 39 is connected between bit lines BL and /BL, and receives a bit line equalize signal /BLEQ at its gate. In response to signal /BLEQ pulled down to an L level of activation, P-channel MOS transistor 39 conducts, whereby the potentials of bit lines BL and /BL are equalized.

As shown in FIG. 2, column select gate 13 includes transfer gates 14 and 15 and an inverter 16 provided corresponding to bit lines BL and /BL. Transfer gate 14 is connected between the other end of bit line BL and a data input/output line IO. Transfer gate 15 is connected between the other end of bit line /BL and a data input/output line /IO. Column select line CL is directly connected to the N-channel MOS transistor side gate of corresponding transfer gates 14 and 15, and connected to the P-channel MOS transistor side gate of corresponding transfer gates 14 and 15 via corresponding inverter 16. When any column select line CL from (m+1) column select lines CL0–CLn is pulled up to an H level of selection, transfer gates 14 and 15 corresponding to that pulled up column select line CL conduct, whereby bit line pair BL and /BL corresponding to that column select line CL is coupled with data input/output line pair IO, /IO.

Row decoder 20 selects any of (n+1) word lines WL0–WLn according to row address signals RA0–RAa from control circuit 5 to drive the selected word line WL to an H level of selection. Specifically, row decoder 20 includes a NAND gate 21 and an inverter 22 provided corresponding to each word line WL. Each word line WL is assigned unique row address signals RA0–RAa in advance. NAND gate 21 and inverter 22 receive preassigned row address signals RA0–RAa, and pulls up a corresponding word line WL to an H level of selection in response to block select signal BS1 brought to an H level. Block select signal BS1 attains an H level of selection when memory block MB1 is specified by address signals A0–Aj.

Column decoder 23 selects any of (m+1) column select lines CL0–CLm according to address signals CA0–CAa from control circuit 5 to pull up the selected column select line CL to an H level of selection. Specifically, column decoder 23 includes a NAND gate 24 and an inverter 25 provided corresponding to each column select line CL. Each column select line CL is assigned unique column address signals CA0–CAb in advance. NAND gate 24 and inverter 25 pull up corresponding column select line CL to an H level of selection in response to input of preassigned column address signals CA0–CAb.

In a write operation, write driver 26 drives one of data input/output lines IO, /IO to an H level and the other of data input/output lines IO, /IO to an L level according to write data signal D. In a read operation, sense amplifier 27 compares the potentials of data input/output lines IO, /IO to output a data signal Q of a logic level corresponding to the comparison result.

The operation of memory block MB1 shown in FIGS. 2 and 3 will be described hereinafter. It is assumed that memory block MB1 is selected and block select signal BS1 is at an H level of selection. In a write operation, word line WL of the row specified by row address signals RA0–RAa is pulled up to an H level of selection by row decoder 20, whereby respective memory cells MC of that row are rendered active. Then, column select line CL of a column specified by column address signals CA0–CAb is pulled up to an H level of selection by column decoder 23, whereby transfer gates 14 and 15 of that column are rendered conductive. One activated memory cell MC is connected to write driver 26 via bit line pair BL and /BL and data input/output line pair IO, /IO.

Write driver 26 drives one of data input/output lines IO, /IO to an H level and the other data input/output line to an L level according to write data signal D to write data into memory cell MC. When word line WL and column select line CL are pulled down to an L level, data is stored into memory cell MC.

In a reading operation, column select line CL of the column specified by column address signals CA0–CAb is pulled up to an H level of selection. Transfer gates 14 and 15 of that column are rendered conductive, whereby bit lines BL and /BL are connected to sense amplifier 27 via data input/output line pair IO, /IO. Then, bit line equalize signal /BLEQ is brought to an L level of activation, whereby each P-channel MOS transistor 39 conducts. In response, the potentials of bit lines BL and /BL are equalized.

After bit line equalize signal /BLEQ attains an H level of inactivation and each P-channel MOS transistor 39 is rendered nonconductive, word line WL of a row according to row address signals RA0–RAa is pulled up to an H level of selection. In response, each memory cell MC of that row is rendered active. Accordingly, current flows from one of bit lines BL and /BL to memory cell MC according to the stored data in memory cell MC. In response, the potential of one of data input/output lines IO, /IO is reduced. Sense amplifier 27 compares the potentials of data input/output lines IO, /IO to output a data signal Q of a logic level corresponding to the comparison result.

Figure 4:
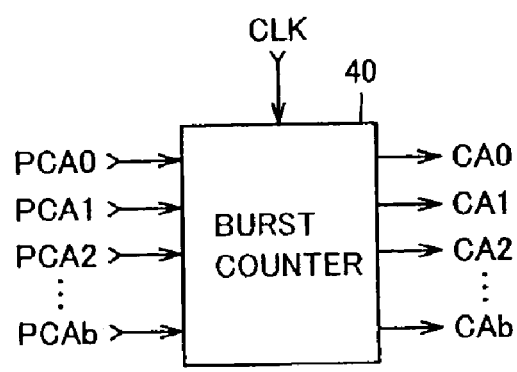
FIG. 4 is a block diagram of a burst counter in a control circuit 5 of FIG. 1.

In a burst operation where data signals are written/read out continuously, a plurality of (for example, 4) column select lines are sequentially brought to an H level for every one clock cycle. The second and subsequent column address signals CA0–CAb are generated in control circuit 5. Specifically, control circuit 5 includes a burst counter 40, as shown in FIG. 4. Burst counter 40 latches internal column address signals PCA0–PCAb generated based on external address signals A0–Aj, and provides the same as the first of column address signals CA0–CAb. Burst counter 40 counts the number of pulses of clock signal CLK, and increments (+1) the values of output column address signals CA0–CAb. Accordingly, four continuous column address signals CA0–CAb are generated, and four column select lines are sequentially selected. Data signals are sequentially written/read out with respect to four memory cells MC.

Figure 5:
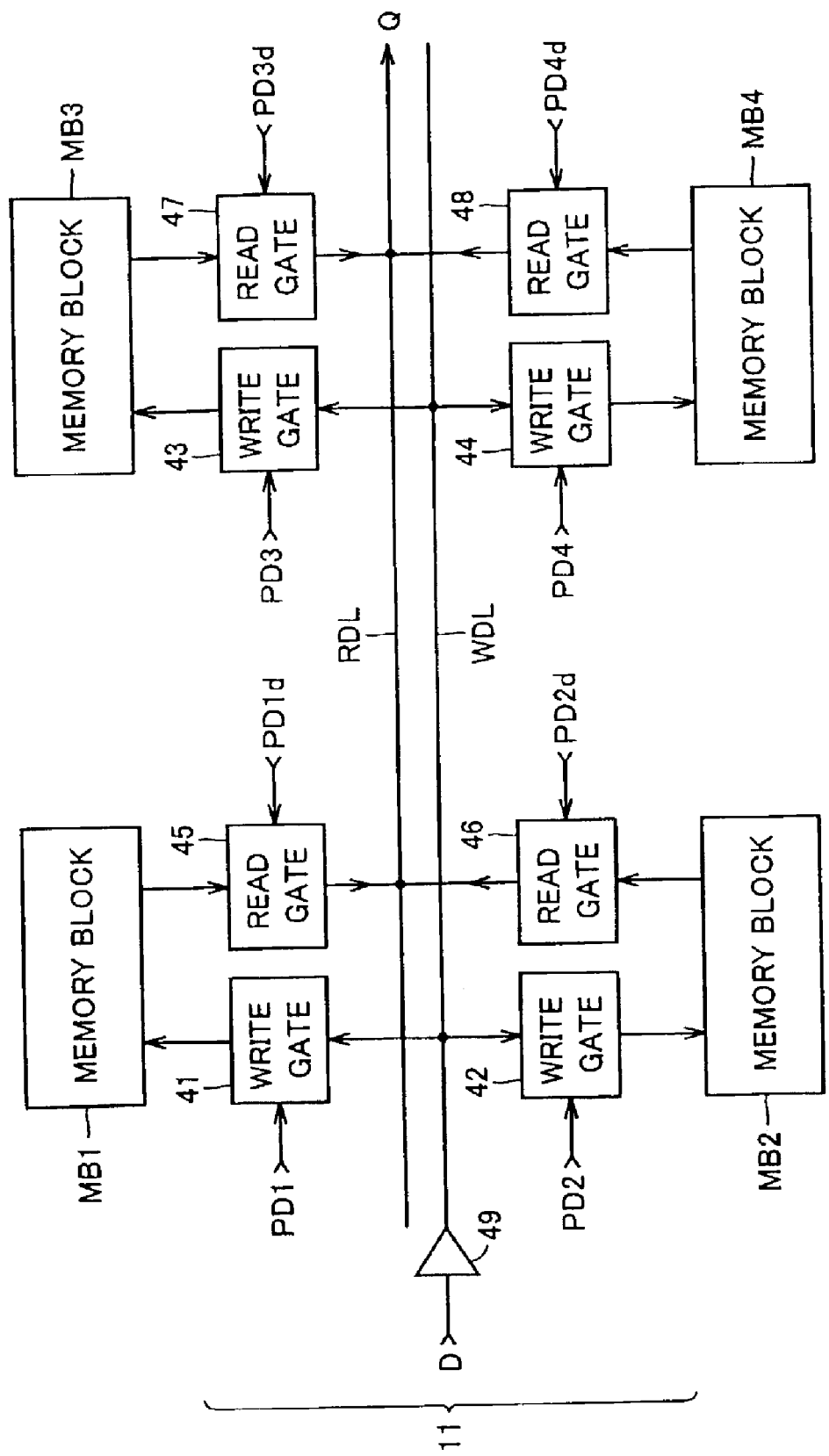
FIG. 5 is a circuit block diagram of a structure of a transfer circuit in FIG. 1.

FIG. 5 is a circuit block diagram of a structure of transfer circuit 11. Referring to FIG. 5, transfer circuit 11 includes write gates 41–44, read gates 45–48, a buffer 49, a write data line WDL and a read data line RDL. Buffer 49 applies write data signal D from selector 9 or register unit 10 to write data line WDL. Write gates 41–44 are provided between respective write data line WDL and write driver 26 of memory blocks MB1–MB4, and conduct in response to respective signals PD1–PD4 attaining an H level of activation. When write gates 41–44 are rendered conductive, data signal D is applied to write driver 26 of memory blocks MB1–MB4.

Read gates 45–48 are provided between sense amplifier 27 of respective memory blocks MB1–MB4 and a read data line RDL, and conduct in response to respective signals PD1d–PD4d attaining an H level of activation. When read gates 45–48 are rendered conductive, read out data signal Q is applied from sense amplifier 27 of respective memory blocks MB1–MB4 to read data line RDL. Read data line RDL is connected to IO buffer 8.

Figure 6:
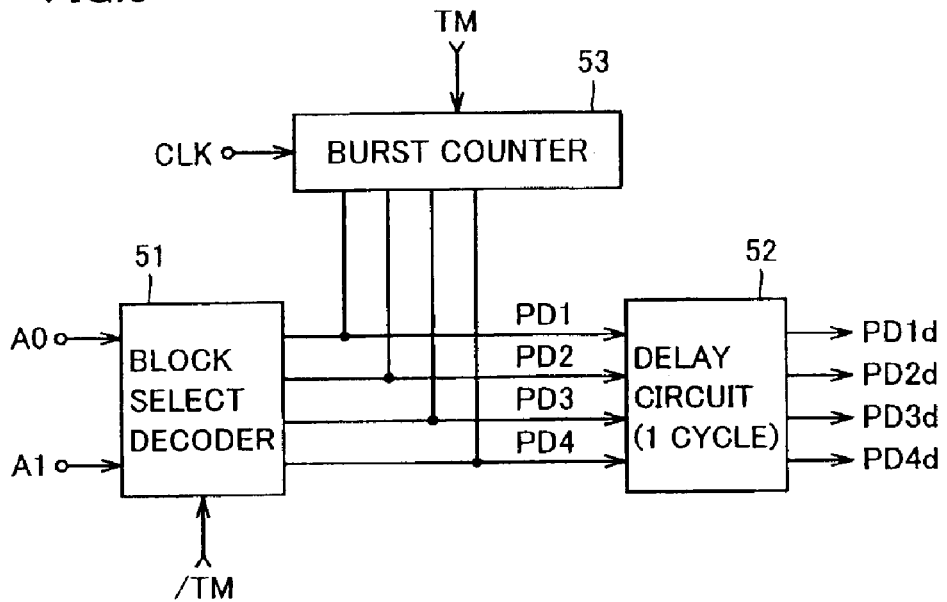
FIG. 6 is a block diagram of a structure of the portion related to generation of a transfer control signal in FIG. 5.
Figure 7:
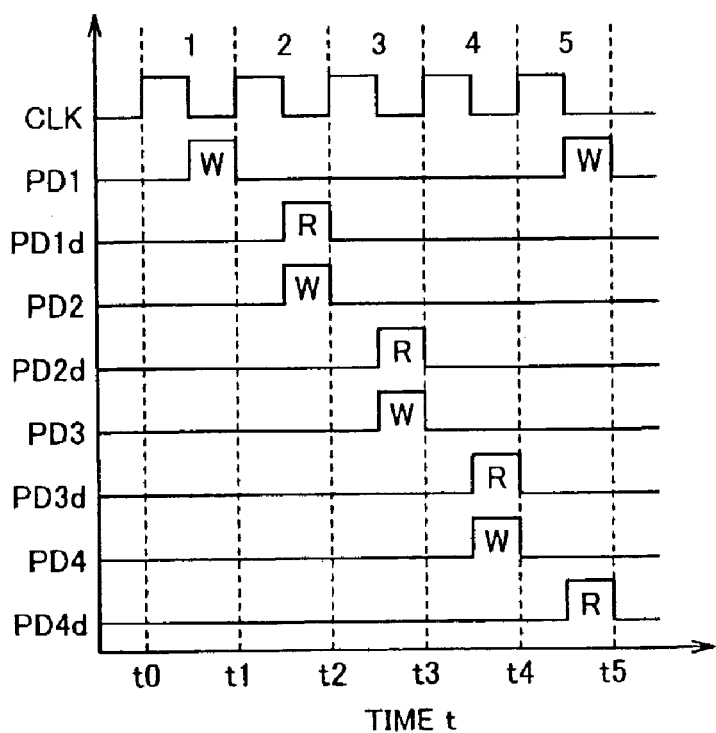
FIG. 7 is a timing chart of an operation of the burst counter and delay circuit in FIG. 6.

FIG. 6 is a block diagram representing the portion related to generation of transfer control signals PD1–PD4 and PD1d–PD4d in control circuit 5. Referring to FIG. 6, control circuit 5 includes a block select decoder 51, a delay circuit 52, and a burst counter 53. Block select decoder 51 is rendered active when test mode signal TM is at an L level of inactivation, i.e., when in a normal operation mode, to select any of transfer control signals PD1–PD4 according to address signals A0 and A1 to pull up the selected signal to an H level of selection at a predetermined timing. Burst counter 53 is rendered active when test mode signal TM is at an H level of activation, i.e., when in a test mode, to bring signals PD1–PD4 to an H level at every 1/2 cycle in synchronization with clock signal CLK, as shown in FIG. 7. Delay circuit 52 delays signals PD1–PD4 by just one cycle to generate signals PD1d–PD4d.

For example, at cycle 1, signal PD1 attains an H level to render write gate 41 conductive, whereby data signal D is written into memory cell MC of memory block MB1. At cycle 2, signals PD1d and PD2 attain an H level to render read gate 45 conductive, whereby read out data signal Q of memory block MB1 is applied to read data line RDL. Also, write gate 42 is rendered conductive, whereby data signal D is written into memory cell MC of memory block MB2.

At cycle 3, signals PD2d and PD3 attain an H level to render read gate 46 conductive, whereby read out data signal Q of memory block MB2 is applied to read data line RDL. Also, write gate 43 is rendered conductive, whereby data signal D is written into memory cell MC of memory block MB3.

At cycle 4, signals PD3d and PD4 attain an H level to render read gate 47 conductive, whereby read out data signal Q of memory block MB3 is applied to read data line RDL. Also, write gate 44 is rendered conductive, whereby data signal D is written into memory cell MC of memory block MB4.

At cycle 5, signals PD4d and PD1 attain an H level to render read gate 48 conductive. Read out data signal Q of memory block MB4 is applied to read data line RDL. Also, write gate 41 is rendered conductive, whereby data signal D is written into memory cell MC of memory block MB1.

Figure 8:
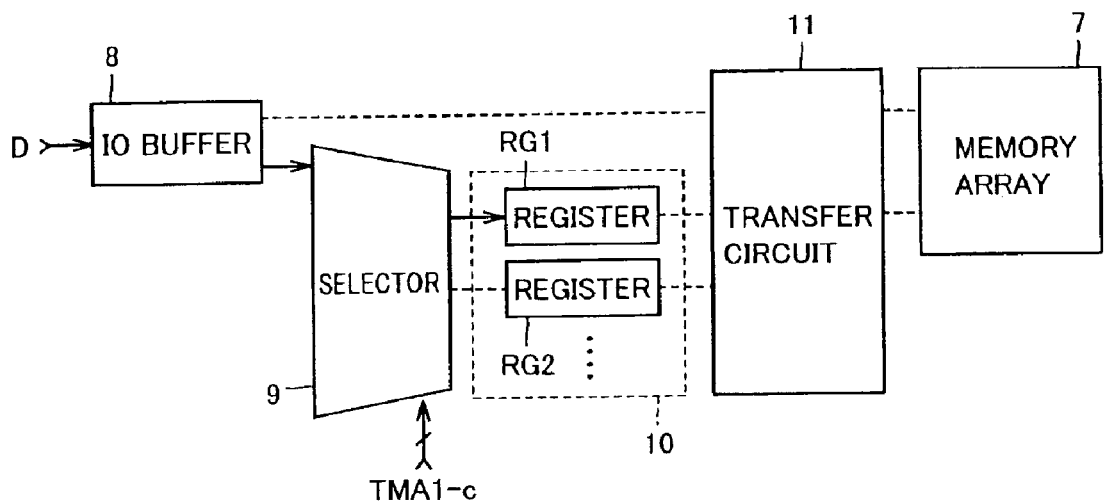
FIG. 8 is a block diagram to describe the operation of the SRAM of FIGS. 1–7 in a test mode.
Figure 9:
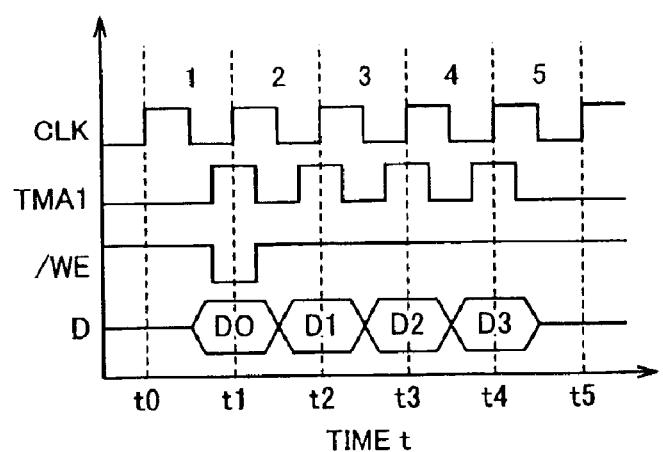
FIG. 9 is a timing chart of an operation in the test mode of FIG. 8.

The operation of this SRAM in a test mode will be described here. The SRAM has a tester (not shown) connected. The tester writes test data signals D0–D3 of the burst length (4 here) to a desired register (for example, RG1) among a plurality of registers RG1–RGc in register unit 10, as shown in FIGS. 8 and 9. Specifically, the tester renders active a test mode signal TMA1 corresponding to register RG1 among test mode signals TMA1–TMAc. Signal TMA1 rendered active becomes the delay signal of clock signal CLK, and attains an H level at the rising edge of clock signal CLK. The tester pulls down signal /WE to an L level in synchronization with a rising edge (time t1) of clock signal CLK, and inputs the first data signal D0. Then, three data signals D1–D3 are sequentially input in synchronization with a rising edge of clock signal CLK. Accordingly, test data signals D0–D3 are written into register RG1 via IO buffer 8 and selector 9.

Figure 10:
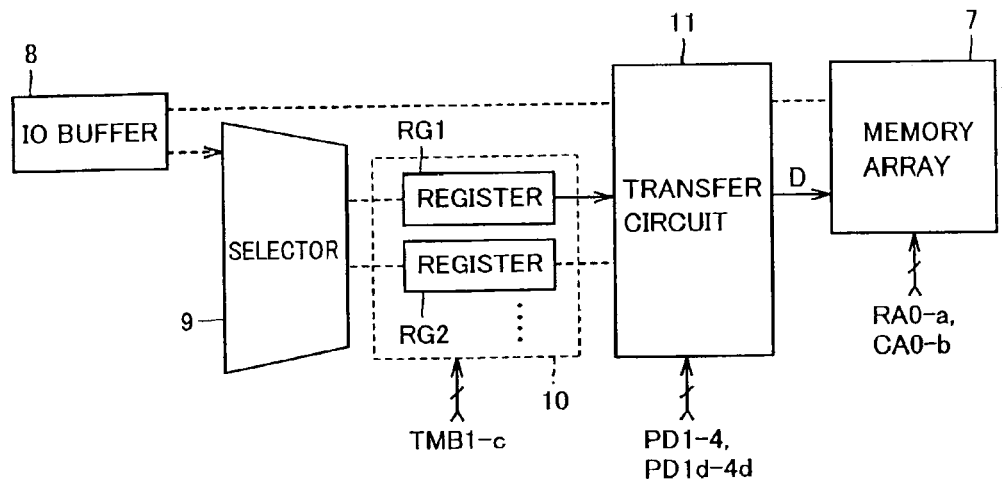
FIG. 10 is a block diagram to describe an operation of the SRAM of FIGS. 1–7 in a test mode.
Figure 11:
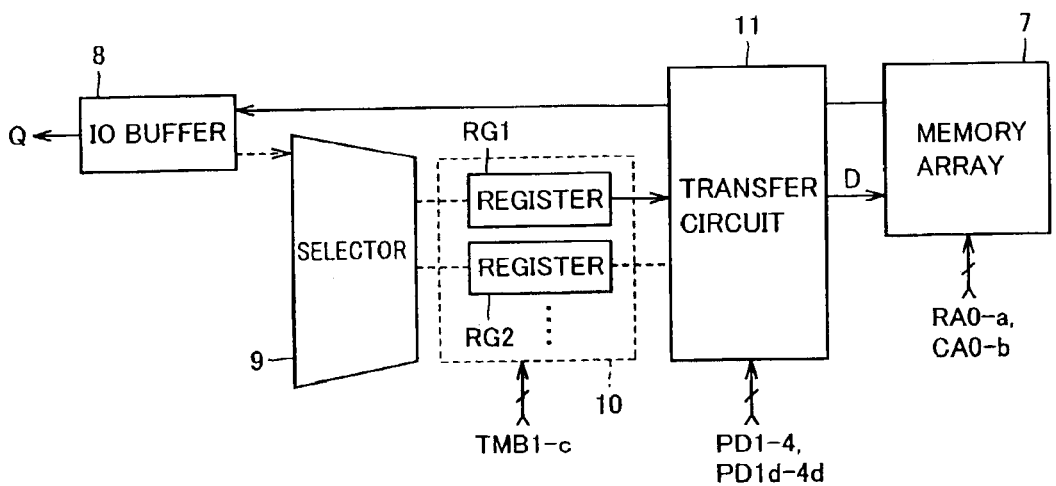
FIG. 11 is another block diagram to describe the operation of the SRAM of FIGS. 1–7 in a test mode.
Figure 12:
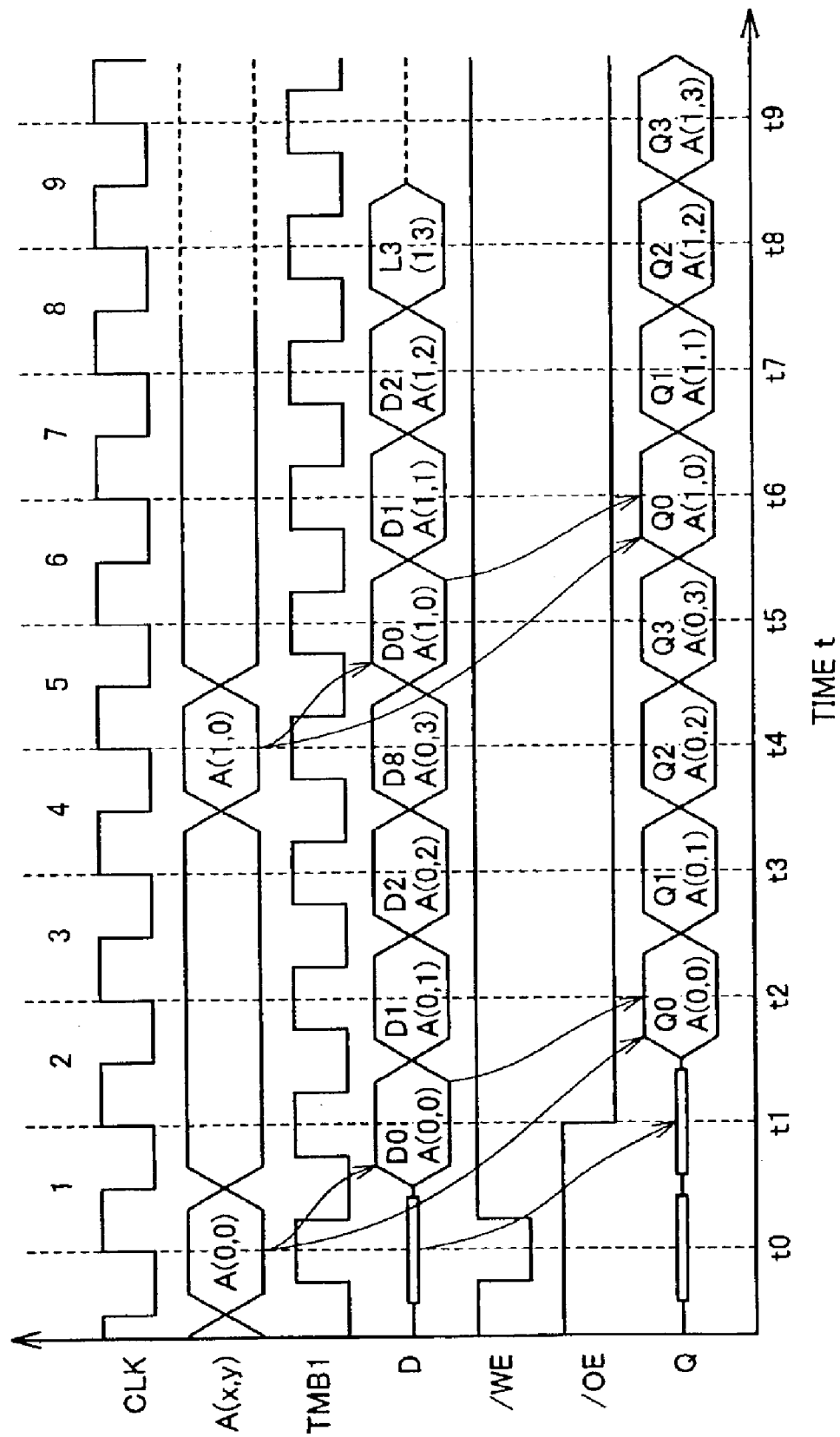
FIG. 12 is a timing chart of an operation in the test mode described in FIGS. 10 and 11.

Referring to FIGS. 10–12, the tester has data signals D0–D3 in register RG1 burst-written into a plurality of memory cells MC in memory array 7, and has data signals Q0–Q3 read out in a bursting manner from the plurality of memory cells MC where data signals D0–D3 are written. Specifically, a test mode signal TMB1 among test mode signals TMB1–TMBc corresponding to a desired register RG1 is rendered active. Signal TMB1 rendered active becomes a delay signal of clock signal CLK, and attains an H level at the rising edge of clock signal CLK. Then, the tester inputs a start address signal A (0, 0) (address signal specifying memory cell MC located at the 0th row and 0th column in FIG. 2) in synchronization with a rising edge (time t0) of clock signal CLK, and brings signal /WE to an L level. As shown in FIGS. 6 and 7, write gate 41 corresponding to memory block MB1 is rendered conductive at cycle 1. Data signal D0 output from register RGJ is written into memory cell MC specified by address signal A (0,0) in memory block MBJ1. The write latency is 1 cycle here.

At the next rising edge (time t1) of clock signal CLK, burst counter 40 of FIG. 4 generates an address signal A (0,1) (address signal specifying a memory cell MC located at the 0th row and first column in FIG. 2) that is an incremented version of address signal A (0,0). As shown in FIGS. 6 and 7, read gate 45 corresponding to memory block MB1 as well as write gate 42 corresponding to memory block MB2 are rendered conductive at cycle 2. Data signal Q0 is read out from memory cell MC that is specified by address signal A (0,0) in memory block MB1. Also, data signal D1 is written into a memory cell MC specified by address signal A (0, 1) in memory block MB2.

Similarly at cycle 3, data signal Q1 is read out from memory cell MC specified by address signal A (0, 1) in memory block MB2, and data signal D2 is written into memory cell MC specified by address signal A (0, 2) in memory block MB3.

At cycle 4, data signal Q2 is read out from memory cell MC specified by address signal A (0, 2) of memory block MB3, and data signal D3 is written into memory cell MC specified by address signal A (0, 2) in memory block 4.

At cycle 4, the next start address signal A (1, 0) is input. At cycle 5, data signal Q3 is read out from memory cell MC specified by address signal A (0, 3) of memory block MB4. Also, data signal D0 is written into memory cell MC specified by address signal A (1, 0) in memory block MB1. Thus, in a similar manner, data signal writing/reading is conducted with respect to all the memory cells MC.

Determination is made that, when the logic level of a read out data signal Q of memory cell MC matches an expected value (the logic level of data signal D written into that memory cell MC), that memory cell MC is proper. When the logic level of read out data signal Q of memory cell MC does not match the expected value, determination is made that the relevant memory cell is defective. The address signal of that defective memory cell MC is stored in the tester.

The defective memory cell MC is replaced with a spare memory cell (not shown). In the case where the defective memory cell MC cannot be replaced with a spare memory cell, that SRAM is discarded.

Since data signals D0–D3 for writing are output from register RG in the present embodiment, it is not necessary to additionally apply a data signal for writing from the tester. Furthermore, since four memory cells MC are selected in response to one of address signals A0–Aj and data signal writing/reading is conducted on the selected memory cell MC, the number of address signals A0–Aj to the input can be reduced. Therefore, the testing can be simplified.

Since data signal writing and reading are carried out concurrently in a test mode, the time required for testing can be shortened as compared to the conventional case where a data signal is read out from respective memory cells MC after data signals are written into all respective memory cells MC.

Although only one register RG1 is employed in the present embodiment, a plurality of registers RG1–RGc may be employed instead in which data signals D0–D3 of patterns differing from each other are stored. In this case, registers RG1–RGc are appropriately switched. This is advantageous in that a more complicated test pattern can be written into memory array 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operating in synchronization with a clock signal, comprising:

a plurality of memory cells;

a register sequentially providing one by one N (N is an integer of at least 2) data signals written in advance in a test mode testing whether each memory cell is proper or not;

a decoder sequentially selecting one by one N memory cells from said plurality of memory cells according to an address signal;

a write circuit sequentially writing the N data signals output from said register into the N memory cells selected by said decoder; and a read circuit operating later than said write circuit by M (M is an integer of at least 1 and not more than N−1) clock cycles, and sequentially reading out data signals from the N memory cells selected by said decoder.

2. The semiconductor memory device according to claim 1, wherein said decoder comprises a burst counter sequentially incrementing said address signal in synchronization with said clock signal to further generate N−1 address signals.

3. The semiconductor memory device according to claim 1, wherein said plurality of memory cells are divided into N memory blocks, each including a plurality of memory cells,
wherein said decoder sequentially selects one by one N memory cells from said N memory blocks respectively according to said address signal.

4. The semiconductor memory device according to claim 1, wherein a plurality of registers are provided,
said semiconductor memory device further comprising a select circuit selecting any of said plurality of registers according to a select signal to provide a data signal output from the selected register to said write circuit.

5. A method of testing the semiconductor memory device defined in claim 1, comprising the steps of:
rendering said semiconductor memory device active to set said semiconductor memory device at a test mode;
applying said address signal to said decoder; and
determining whether each memory cell is proper or not based on a data signal read out by said read circuit.

* * * * *